United States Patent [19]

Tanabe

[11] 4,327,167
[45] Apr. 27, 1982

[54] METHOD OF PRODUCING PRINTED CIRCUIT BOARDS

[75] Inventor: Osamu Tanabe, Nagaokakyo, Japan

[73] Assignee: Dainippon Screen Manufacturing Co., Ltd., Kyoto, Japan

[21] Appl. No.: 207,199

[22] Filed: Nov. 14, 1980

[30] Foreign Application Priority Data

Mar. 14, 1980 [JP] Japan .................. 55-33070

[51] Int. Cl.³ .................. G03G 13/22; B44C 1/22
[52] U.S. Cl. .................. 430/31; 430/49; 430/318; 430/319; 156/656; 156/901
[58] Field of Search .................. 430/31, 49, 317, 318, 430/319, 329; 156/630, 634, 656, 901

[56] References Cited

U.S. PATENT DOCUMENTS 2,947,625  8/1960  Bertelsen .................. 156/901 X
3,061,911  11/1962  Baker .................. 430/31 X
4,145,460  3/1979  Finley et al. .................. 156/656 X

FOREIGN PATENT DOCUMENTS 52-58873  5/1977  Japan .................. 156/901
55-5874  2/1980  Japan .................. 430/318

Primary Examiner—Roland E. Martin, Jr.
Attorney, Agent, or Firm—Armstrong, Nikaido, Marmelstein & Kubovcik

[57] ABSTRACT

A method of producing printed circuit boards according to this invention consists of the steps of coating an electrophotographic photosensitive film on both sides of a substrate which consists of a synthetic resin plate with a conductive metal layer on each side; forming a wiring pattern of an acid-resistant toner on the photosensitive film by means of the electrophotography; and etching the substrate to remove unnecessary parts of the conductive metal layers that are not covered with the protective toner and the photosensitive film. With this method, copper-walled holes can be formed easily and accurately.

2 Claims, 12 Drawing Figures

FIG.1-a
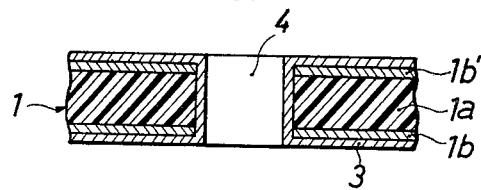
FIG.1-b
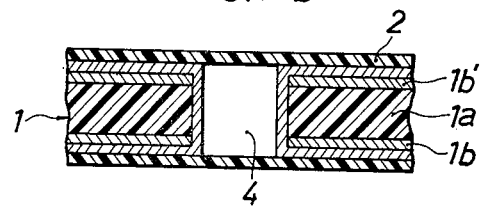
FIG.1-c
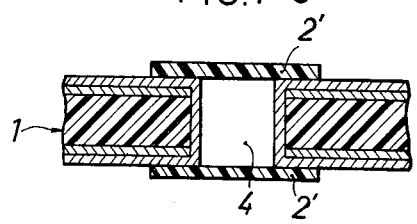
FIG.1-d
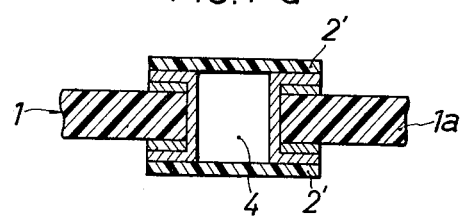
FIG.1-e
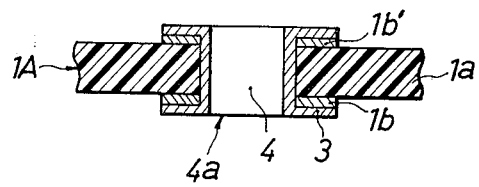

FIG. 2-a
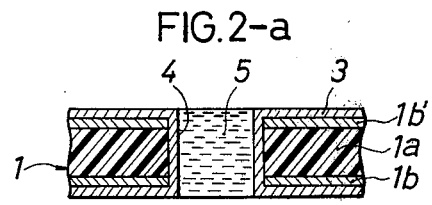
FIG. 2-b
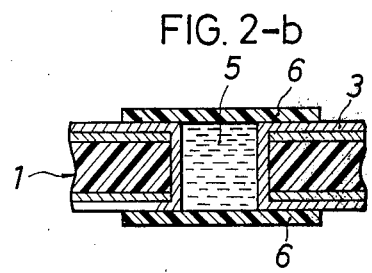
FIG. 2-c
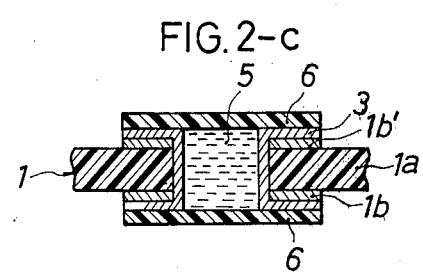
FIG. 3-a
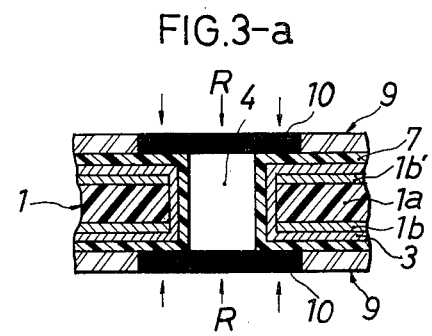
FIG. 3-b
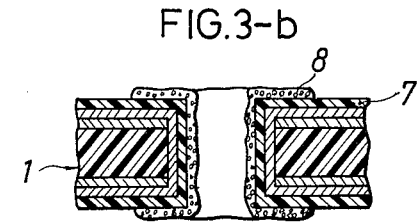
FIG. 3-c
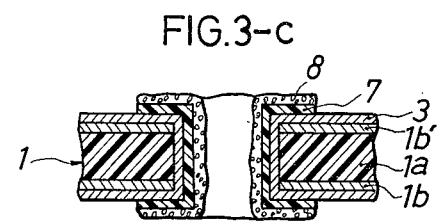
FIG. 3-d
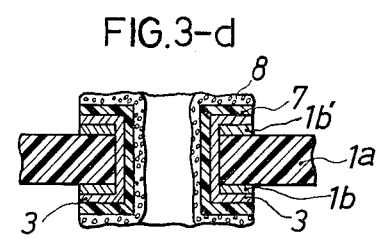

METHOD OF PRODUCING PRINTED CIRCUIT BOARDS

BACKGROUND OF THE INVENTION

This invention relates to a method of forming a conductive wiring pattern on an insulating substrate by making use of an electrophotography and more particularly to a process of producing printed circuit boards by which the copper-walled holes in the substrate can be formed easily and accurately.

The printed circuit board, which consists of an insulating synthetic resin board with copper conducting paths on both sides, has copper-walled holes that make electrical connections between the two sides and in which terminals or legs of electronic components are mounted and welded by solder.

There are two conventional methods of producing the printed circuit board having copper-walled holes: (A) a tenting method and (B) a hole-plugging method.

The process of the tenting method (A) is shown in FIG. 1. As shown in FIG. 1-a, a hole 4 about 1 mm in diameter is made through the substrate 1 at a desired location. The substrate 1 consists of a synthetic resin board 1a with a thin copper layer 1b, 1b' plated on both sides. The both sides of the substrate 1 and the wall of the hole 4 are plated with a copper layer 3 about 1 $\mu$m thick.

Then, as shown in FIG. 1-b, a dry resist film 2 is coated on the surface of the copper layer 3 and a wiring pattern is placed on the dry resist film 2, which is then exposed. The exposed dry resist film 2 is then processed in a solution to produce the wiring pattern of the film 2'. In this treatment a portion 2' of the dry resist film that was exposed to light remains while the unlit portion of the film is removed.

When the substrate is etched, the acid bath erodes the exposed parts of the copper layer 3, 1b, 1b', with the remaining dry resist film 2' on the hole serving as a protective film. And the copper layers covered with the dry resist film 2' at the hole 4 remain as shown in FIG. 1-d.

The final step is to remove the remaining dry resist film 2' from the substrate. With the dry resist film 2' removed, the printed circuit board 1A is obtained in which the plated layer of copper 3 is formed inside the hole 4 as well as the upper and lower surfaces of the substrate around the hole.

The hole-plugging method is performed in the following way. As shown in FIG. 2-a, a hole 4 is made through a substrate 1 which consists of an insulating base plate plated with a copper layer 3 on both sides and on the wall of the hole 4. An acid-resistant ink 5 is charged into the hole 4 and the substrate 1 is polished on the surfaces. A photoresist is applied to a certain portion of the substrate 1 to form a layer of the photoresist 6. A wiring pattern is placed on the photoresist layer 6 and exposed to light. The photoresist layer 6 is washed in the solution to remove unnecessary portions of the photoresist layer, as shown in FIG. 2-b.

The substrate is then etched to remove unnecessary portions of the copper layers 3, 1b, 1b', as shown in FIG. 2-c, with the remaining photoresist layer 6 serving as a protective film. After this, the ink 5 in the hole 4 and the photoresist layer 6 are removed to obtain the printed circuit board 1A with a copper-walled hole 4a, which is the same as the one shown in FIG. 1-e.

In the above process, instead of applying the photoresistant substance 6, the substrate may be printed with the acid-resistant ink by screen printing and bathed in the acid bath to remove the exposed parts of the copper layers. Then, the acid-resistant ink and the ink charged into the hole 4 are removed to obtain the printed circuit board 1A the same as shown in FIG. 1-e.

The above methods of producing the printed circuit board have various drawbacks. In the tenting method, the dry resist film is very expensive, resulting in an increase in the production cost of the printed circuit board. The hole-plugging method requires additional processes of charging and removing ink into/from the hole. The photoresistant substance coated on the substrate has low sensitivity and therefore cannot be processed at a high speed. Moreover, exposing device used in this method is expensive.

In the method using the screen printing, the accuracy of the wiring pattern is low because the screen itself has flexibility.

This invention has been accomplished to overcome the above-mentioned drawbacks encountered with the conventional techniques: i.e., high cost in the tenting method, complicated process in the hole-plugging method, and inaccurate wiring pattern with the screen printing method.

BRIEF SUMMARY OF THE INVENTION

To achieve the above objective, the method of producing the printed circuit board according to this invention employs an electronic photography and comprises the steps of: coating an electrophotographic photosensitive film on the surfaces of a synthetic resin insulating plate or substrate and on the inner wall of holes made through the substrate at predetermined locations, the insulating substrate having a conductive metal layer on both sides; forming a wiring pattern with acid-resisting toner on the photosensitive film by means of the electrophotography; removing the exposed portions of the photosensitive film that are not covered with the wiring patterns of the toner; etching the substrate to remove the exposed parts of conductive metal layers that are not covered with the photosensitive film; and removing the remaining acid-resistant toner and the photosensitive film from the substrate.

With the method of this invention, it is possible to form the copper-walled holes easily and accurately, the most important process in producing the printed circuit board.

BRIEF DESCRIPTION OF THE DRAWINGS

FIGS. 1-a through 1-e are explanatory drawings showing the process of producing the printed circuit board according to the conventional tenting method;

FIGS. 2-a through 2-c are explanatory drawings showing the process of producing the printed circuit board in accordance with the conventional hole-plugging method; and FIGS. 3-a through 3-d are explanatory drawings showing the process of forming the copper-walled holes of the printed circuit board according to the present invention.

DESCRIPTION OF THE PREFERRED EMBODIMENT

This invention relates to a method of producing a printed circuit board with copper-walled holes by making use of electrophotography.

As shown in FIG. 3-a, a substrate 1 is prepared, which consists of a synthetic resin insulating base plate having a conductive metal layer on both sides. The insulating plate 1a is of phenol resin, polyimide or epoxy glass and normally is 1.6 mm thick (occasionally 0.3–5 mm) and coated on both sides with a thin copper layer 1b and 1b', 35 μm thick. Holes 4, 0.8–1 mm in diameter are cut through the substrate at predetermined locations to receive the terminals of electronic components. The substrate is coated with an electrophotographic photosensitive film 7 on both sides by spraying or dipping it in a bath. The photosensitive film 7 is formed also on the inner wall of the holes 4.

The photosensitive film can be electrostatically charged and the electrostatic charge will be dissipated by light. This characteristic of the photosensitive film is utilized effectively in producing a wiring pattern on the substrate. As the photosensitive film, an organic photoconductive film (abridged as O.P.C. film) is used.

The photosensitive films 7 coated on the substrate 1 are electrostatically charged in a dark room. A wiring pattern 9 is placed on one or both sides of the substrate, which is then irradiated with light rays R. The electrostatic charge in the photosensitive film 7 is dissipated where the light R passing through the wiring pattern 9 strikes, but remains in unlit areas near the holes 4 corresponding to the dark portion 10 or the wiring pattern 9.

The substrate 1 is then processed to develop the wiring pattern of the toner 8 on the photosensitive film by the method of electrophotography. In this process the toner 8 adheres also to the inner wall of the holes 4.

As shown in FIG. 3-c, the portions of the photosensitive film 7 that are not covered with the toner are etched by the alkaline solution. Thus, two layers of toner and the photosensitive film remains on the holes 4a.

This substrate is etched to remove unnecessary parts of the copper layers 3, 1b, 1b' that are not covered with the toner 8. The toner 8 adhering to the hole, and the photosensitive film 7 are removed by the thinner to obtain the printed circuit board 1A with copper-walled holes 4a as shown in FIG. 1-e.

The process of producing the printed circuit board according to this invention can be summarized as follows: The electrophotographic photosensitive film 7 is coated on the surfaces of the substrate 1 and the inner wall of the holes 4; the photosensitive film 7 is electrostatically charged according to the wiring pattern 9 by the electrophotography; this substrate is processed to form the wiring pattern of the toner 8 on the photosensitive film 7; the parts of the photosensitive film 7 that are not covered with the acid-resistant toner 8 are erroded by the acid bath; the substrate is then etched to errode and remove the exposed copper layers; and the toner 8 and the photosensitive film 7 that remain as the protective films on the holes 4 and wire pattern are washed and removed by solvent, thus producing the printed circuit board that has a desired wiring pattern. With this process, the copper-walled holes can easily and accurately be formed.

The advantages of this invention are as follows.

A. The photoresist film used in the tenting method and the hole-plugging method requires a long exposure to ultraviolet rays. This invention, however, uses the electrophotographic photosensitive film that has much high sensitivity compared with the former so that the image can be developed at high speed. This makes it possible to simplify and automate the exposing device.

B. The electrophotographic photosensitive film is inexpensive as compared with the dry resist film; the cost is about one tenth of the dry resist film. Combined with the easiness with which the photosensitive film can be processed, the low cost of the photosensitive film greatly reduces the production cost of the printed circuit board.

C. In the conventional screen printing method, the pattern itself is flexible, so that the printed circuit may become inaccurate. This invention, however, employs an electrophotographic printing which ensures high accuracy of the printed wiring pattern.

D. The hole-plugging method requires the additional process of charging acid-resistant ink into the holes. But this invention obviates this process.

E. As can be seen in the foregoing, since this invention employs an electrophotography in which a wiring pattern is placed on the electrostatically charged photosensitive film which is then exposed to light to form the exact wiring pattern of the acid-resistive toner, the accurate pattern can very easily be obtained.

What is claimed is:

1. A method of producing printed circuit boards comprising the steps of: coating an electrophotographic photosensitive film on both sides of a synthetic resin insulating plate or substrate and on the inner wall of the holes made through the substrate at predetermined locations wherein the electrophotographic photosensitive film is coated to both sides of the entire substrate and to the inner wall of the holes without any interruption in the film, the insulating substrate having a conductive metal layer on both sides and conductive metal on said inner wall of said holes; forming a wiring pattern with acid-resistant toner on the photosensitive film by means of the electrophotography; removing the exposed parts of the photosensitive film that are not covered with the wiring patterns of the toner; etching the substrate to remove the exposed parts of conductive metal layers that are not covered with the photosensitive film and toner; and removing the remaining acid-resistant toner and the photosensitive film from the substrate.

2. A method of producing printed circuit boards as set forth in claim 1, wherein the conductive metal layers on both sides of the insulating substrate are thin copper layers.

* * * * *